(12) United States Patent
Bruls et al.

(10) Patent No.: US 11,333,984 B2
(45) Date of Patent: May 17, 2022

(54) APPARATUS FOR AND METHOD OF IN-SITU PARTICLE REMOVAL IN A LITHOGRAPHY APPARATUS

(71) Applicants: ASML Netherlands B.V., Veldhoven (NL); ASML Holding N.V., Veldhoven (NL)

(72) Inventors: Richard Joseph Bruls, Eindhoven (NL); Ronald Peter Albright, Norwalk, CT (US); Peter Conrad Kochersperger, Easton, CT (US); Victor Antonio Perez-Falcon, Bridgeport, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 16/967,794

(22) PCT Filed: Feb. 4, 2019

(86) PCT No.: PCT/EP2019/052581
§ 371 (c)(1),
(2) Date: Aug. 6, 2020

(87) PCT Pub. No.: WO2019/158380
PCT Pub. Date: Aug. 22, 2019

(65) Prior Publication Data
US 2021/0041795 A1 Feb. 11, 2021

Related U.S. Application Data

(60) Provisional application No. 62/629,862, filed on Feb. 13, 2018.

(51) Int. Cl.
*G03F 7/20* (2006.01)
*B08B 6/00* (2006.01)

(52) U.S. Cl.
CPC ............ *G03F 7/70925* (2013.01); *B08B 6/00* (2013.01); *G03F 7/70708* (2013.01)

(58) Field of Classification Search
CPC .. G03F 7/707; G03F 7/70708; G03F 7/70908; G03F 7/70916; G03F 7/70925; B08B 6/00
See application file for complete search history.

(56) References Cited

U.S. PATENT DOCUMENTS 5,671,119 A 9/1997 Huang et al.
6,169,652 B1 1/2001 Klebanoff
(Continued)

FOREIGN PATENT DOCUMENTS

JP 2006-120776 A 5/2006
JP 2007-019443 A 1/2007
(Continued)

OTHER PUBLICATIONS

International Search Report and Written Opinion of the International Searching Authority directed to related International Patent Application No. PCT/EP2019/052581, dated Jun. 24, 2019; 14 pages.
(Continued)

*Primary Examiner* — Peter B Kim
(74) *Attorney, Agent, or Firm* — Sterne, Kessler, Goldstein & Fox P.L.L.C.

(57) ABSTRACT

Methods and systems are described for reducing particles in the vicinity of an electrostatic chuck (300) in which a cleaning reticle or substrate (320) is secured to the chuck, the cleaning reticle or substrate having surfaces partially devoid of conductive material so that an electric field from the chuck can pass through to a volume adjacent the substrate to draw particles (360) in the volume to the surface of the substrate. Voltage supplied to the chuck may have an
(Continued)

alternating polarity to enhance the attraction of particles to the surface.

21 Claims, 7 Drawing Sheets

(56) References Cited

U.S. PATENT DOCUMENTS

| | | |
|---|---|---|
| 2004/0079385 A1 | 4/2004 | Frisa et al. |
| 2004/0218168 A1 | 11/2004 | Van Groos et al. |
| 2005/0088639 A1* | 4/2005 | Lee .................. G03F 7/707 |
| | | 355/75 |
| 2006/0012760 A1 | 1/2006 | Owen |
| 2006/0292457 A1 | 12/2006 | Meijer et al. |
| 2008/0246939 A1 | 10/2008 | Yonekawa et al. |
| 2009/0014030 A1 | 1/2009 | De Jong et al. |
| 2013/0247935 A1 | 9/2013 | Park |
| 2017/0131638 A1 | 5/2017 | Kim et al. |

FOREIGN PATENT DOCUMENTS

| | | |
|---|---|---|
| KR | 20170141734 A | 12/2017 |
| WO | WO 2013/083332 A1 | 6/2013 |

OTHER PUBLICATIONS

International Preliminary Report on Patentability directed to related International Patent Application No. PCT/EP2019/052581, dated Aug. 18, 2020; 10 pages.

* cited by examiner

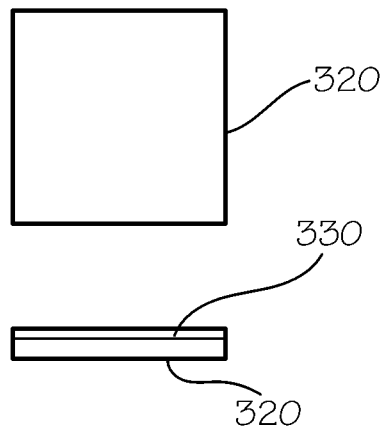 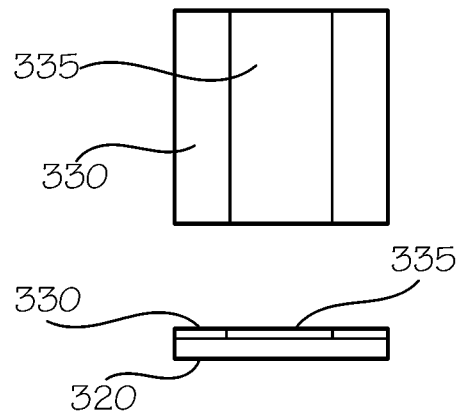
FIG. 4A    FIG. 4B
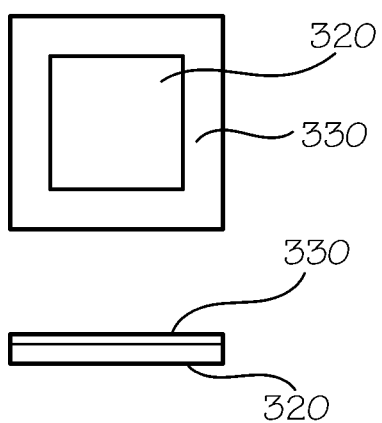 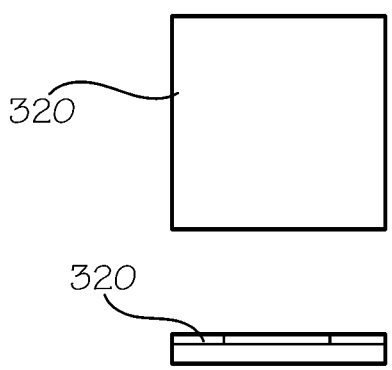
FIG. 4C    FIG. 4D

APPARATUS FOR AND METHOD OF IN-SITU PARTICLE REMOVAL IN A LITHOGRAPHY APPARATUS

CROSS-REFERENCE TO RELATED APPLICATIONS

This application claims priority of U.S. Provisional Patent Application No. 62/629,862, which was filed on Feb. 13, 2018, and which is incorporated herein in its entirety by reference.

FIELD

The present disclosure relates to methods and systems for removing particulate contamination from the vicinity of a support such as a clamp of a chuck, e.g., an electrostatic chuck that is used to hold a device such as a reticle, mask, or wafer inside a lithography apparatus.

BACKGROUND

A lithographic apparatus is a machine that applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

In order to shorten the exposure wavelength and, thus, reduce the minimum printable size, electromagnetic radiation having a wavelength within the range of about 5 nm to about 20 nm, for example within the range of about 13 nm to about 14 nm, is used. Such radiation is termed extreme ultraviolet (EUV) radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a small quantity of fuel, such as droplets of a suitable fuel material (e.g., tin) or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source. The radiation once produced is patterned using a patterning device and then conveyed to the surface of a wafer.

An electrostatic chuck (ESC) is used in a lithography apparatus, for example, to hold a patterning reticle on a scanning stage. Reticle particle contamination (defectivity) is a key critical parameter in EUV technology. In order to mitigate reticle contamination, the volume near the reticle stage is cleaned by so-called flushing. Flushing involves providing a higher than normal gas flow in the reticle area to release (dislodge) particles and remove them from the EUV system. The drawback of flushing is that it is a relative slow cleaning process and has only a limited efficiency.

There is therefore a need for a faster, more efficient in-situ cleaning technique.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, there is disclosed a system in which an electric field generated by an electrostatic chuck is used to attract particles to the front (exposed) side of a sacrificial cleaning reticle or modified substrate. This cleaning substrate has only a partial conductive coating on the reticle backside to allow the E-field to penetrate to space in front of the reticle. By polarity switching in combination with or without EUV exposure charged particles can be attracted to the front side of the substrate.

According to another aspect there is disclosed an apparatus comprising a stage adapted to support a substrate and a voltage supply electrically connected to the stage and adapted to operate in a mode in which the voltage supply switches polarities. The stage may comprise an electrostatic chuck.

According to another aspect there is disclosed an apparatus comprising a stage and a substantially planar substrate arranged on the stage, the substrate having a first surface facing the stage and a second surface facing away from the stage, at least a first portion of the first surface lacking a conductive coating and at least a second portion of the second surface lacking a conductive coating, the first portion and the second portion being arranged with respect to one another such that an electric field can pass through the substrate. The stage may comprise an electrostatic chuck. The first surface may be partially covered with a conductive coating. The apparatus may further comprise a voltage source for applying a voltage to the electrostatic chuck and generating an electric field that extends past the substrate into a space adjacent the second surface. The voltage source may be adapted to alternate polarity of its output voltage. The substrate may be made of a nonconductive material. The first surface may be at least partially coated with a nonconductive material. The second surface may be at least partially coated with a nonconductive material. The nonconductive material may comprise Kapton. Neither the first surface nor the second surface comprises a coating having conductive material, and the combination may further comprise a mechanical clamp for securing the substrate to the electrostatic chuck.

According to another aspect there is disclosed an apparatus comprising a stage, a substantially planar having a first surface and a second surface, the substrate being placed on the stage such that the first surface faces the stage and the second surface faces away from the stage, at least a first portion of the first surface lacking a conductive coating and at least a second portion of the second surface lacking a conductive coating, the first portion and the second portion being arranged with respect to one another such that an electric field can pass through the substrate, and a voltage supply electrically connected to the stage and adapted to operate in a mode in which the voltage supply switches polarities so as to attract particles to the second surface. The stage may comprise an electrostatic chuck. The first surface may be partially covered with a conductive coating. The second surface may be at least partially covered with a nonconductive coating. The voltage supply may be adapted to generate an electric field that extends past the substrate into a volume of space adjacent the second surface. The substrate may be made of a nonconductive material. The first surface may be at least partially coated with a nonconductive material. The nonconductive material may comprises Kapton. Neither the first surface nor the second surface may comprise a coating having conductive material, and the apparatus may further comprise a mechanical clamp for securing the substrate to the electrostatic chuck.

According to another aspect there is disclosed a method comprising the steps of providing a stage and arranging a substantially planar substrate on the stage, the substrate having a first surface and a second surface, at least a first portion of the first surface lacking a conductive coating and at least a second portion of the second surface lacking a conductive coating, the first portion and the second portion being arranged with respect to one another such that an electric field can pass through the substrate, and applying a voltage to the stage and substrate in a manner in which a polarity of the voltage switches at least once. The stage may comprise an electrostatic chuck.

According to another aspect there is disclosed a method comprising the steps of providing a stage, arranging a substantially planar substrate on the stage such that a first surface of the substrate faces the stage and a second surface of the substrate faces away from the stage, at least a first portion of the first surface lacking a conductive coating and at least a second portion of the second surface lacking a conductive coating, the first portion and the second portion being arranged with respect to one another such that an electric field can pass through the substrate, and attracting particles to the second surface by applying a voltage to the stage and substrate in a manner in which a polarity of the voltage switches at least once. The method may further comprise a step before the attracting step of charging the particles. The step of charging the particles may comprise exposing the particles to ionizing radiation. The stage may comprise an electrostatic chuck.

According to another aspect there is disclosed a method comprising the steps of providing a stage, arranging a substantially planar substrate on the stage, the substrate having a first surface facing the stage and a second surface facing away from the stage, at least a first portion of the first surface lacking a conductive coating and at least a second portion of the second surface lacking a conductive coating, the first portion and the second portion being arranged with respect to one another such that an electric field can pass through the substrate, and applying a voltage to the stage and substrate in a manner in an electric field extends past the substrate and into a space adjacent the second surface to attract particles in the space towards the second surface.

According to another aspect there is disclosed a substantially planar cleaning substrate comprising a nonconductive material and having a top substantially planar surface and a bottom substantially planar surface, the top surface comprising at least one first area covered by a layer comprising a conductive material and at least one second area not covered by a layer comprising a conductive material. The conductive material may comprises chromium nitride. The at least one second area may be covered by a layer of a nonconductive material. The nonconductive layer may comprise poly (4,4'-oxydiphenylene-pyromellitimide. The substantially planar cleaning substrate may comprise a nonconductive layer on the second surface. The nonconductive layer may comprise a material adapted to retain particles impinging on the nonconductive layer.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

FIGS. 4A-4D are plan and side views of various substrates with different coating arrangements.

Figure 1:
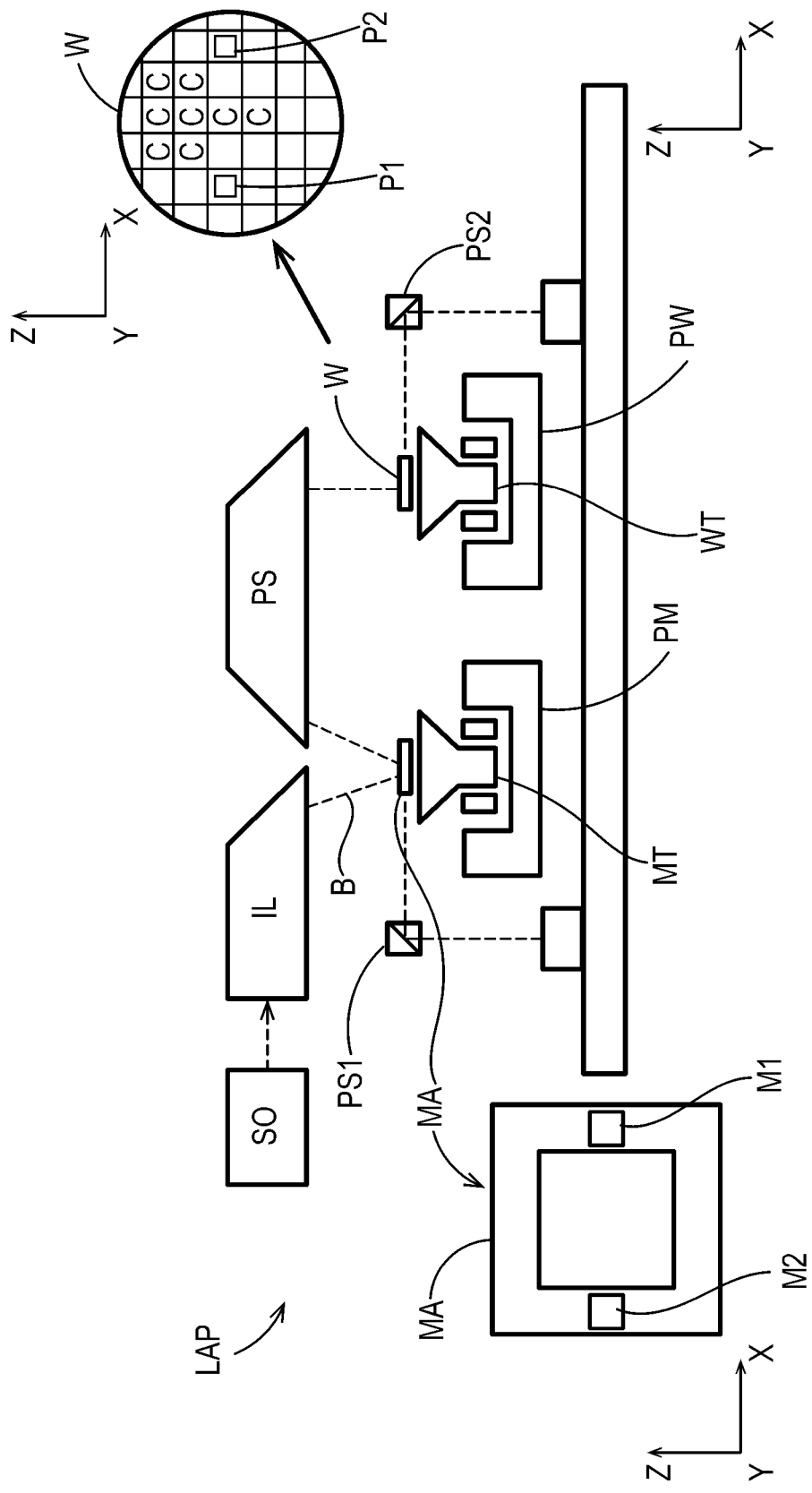
FIG. 1 shows a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic.

Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

In the description that follows and in the claims the terms "up," "down," "top," "bottom," "vertical," "horizontal," and like terms may be employed. These terms are intended to show relative orientation only and not any absolute orientation such as orientation with respect to gravity unless otherwise intended as indicated. Similarly, terms such as left, right, front, back, etc., are intended to give only relative orientation.

Before describing embodiments in more detail, it is instructive to present an example environment in which embodiments of the present invention may be implemented.

FIG. 1 schematically shows a lithographic apparatus LAP including a source collector module SO according to an embodiment of the present invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask). The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of several modes. For example, in a step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In a scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-) magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
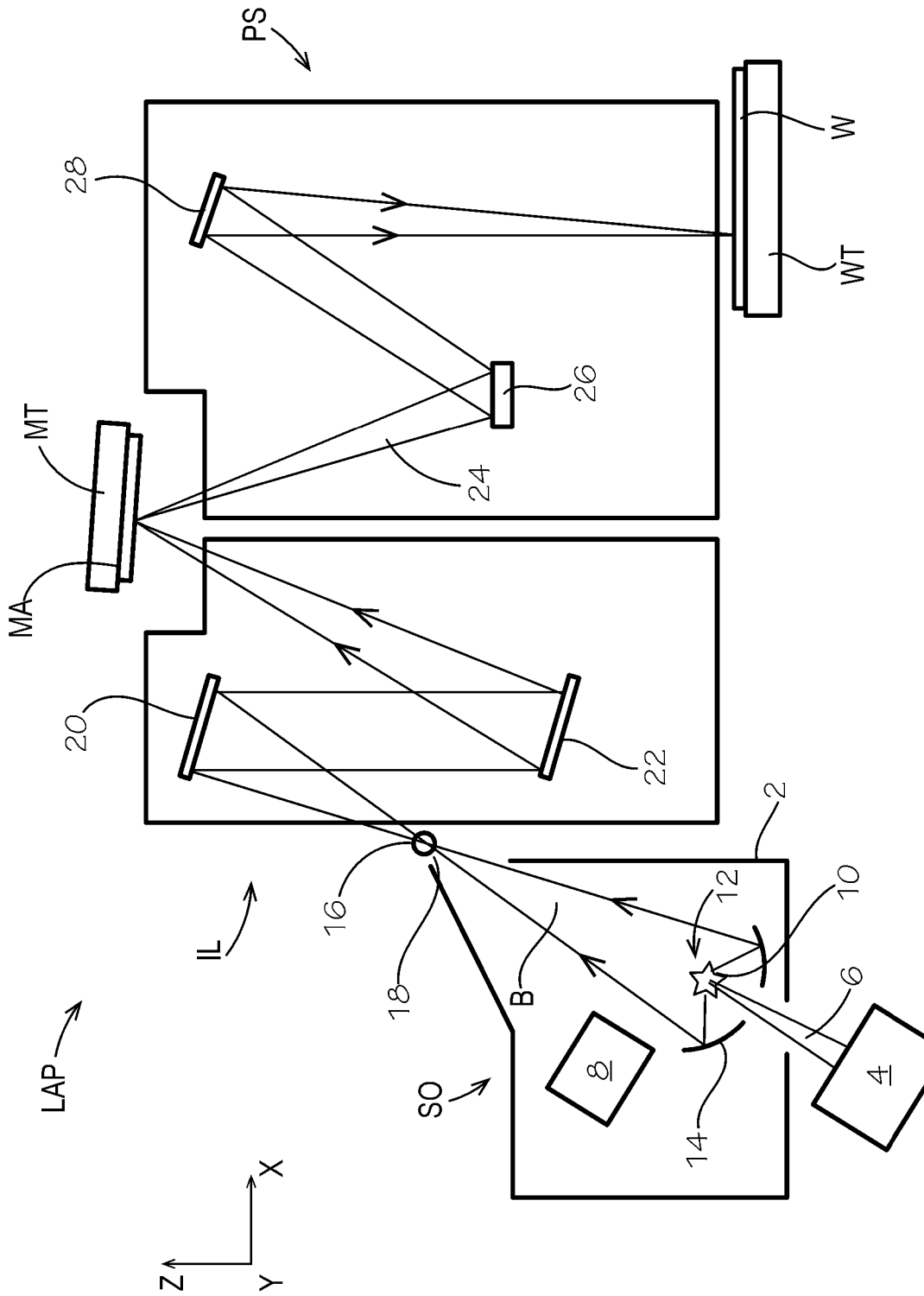
FIG. 2 is a more detailed view of the apparatus of FIG. 1, including an LPP source collector module, according to an embodiment.

FIG. 2 shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a volume of fuel, such as xenon (Xe), tin (Sn) or lithium (Li) that is provided from a fuel supply 8 (sometimes referred to as a fuel stream generator). The deposition of laser energy into the fuel creates a highly ionized plasma 10 at a plasma formation location 12 that has electron temperatures of several tens of electron volts (eV). The energetic radiation generated during de-excitation and recombination of these ions is emitted from the plasma 10, collected and focused by a near normal incidence radiation collector 14. A laser 4 and a fuel supply 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat or otherwise precondition the volume of fuel before the laser beam 6 is incident upon it. An LPP source that uses this approach may be referred to as a dual laser pulsing (DLP) source.

Although not shown, the fuel stream generator will generally comprise, or be in connection with, a nozzle configured to direct a stream of fuel, for example in the form of droplets) along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be additional reflective elements present in the projection system PS than shown in FIG. 2.

Embodiments as described herein may be used for contamination control in many different lithography tools, including in an extreme ultra-violet (EUV) lithography device. EUV reticles, being reflective by nature, are very vulnerable to contamination, and are difficult to clean using manual procedures.

Electrostatic forces, with or without EUV plasma, can play a significant role in particle transport. The reticle stage electrostatic clamp can in principle be used the generate E-fields. Typically such fields are shielded (confined between clamp and reticle backside) by clamping to a reticle with a conductive backside coating. This conductive coating is needed for effectively clamping the reticle. Eliminating at least part of the conductive coating, however, permits the E-field to penetrate the substrate into the space beyond the substrate. The use of such an E-filed in combination with a nonconductive coating at least partially covering a surface of the substrate provides the basis of an efficient method to dislodge particles and subsequently trap them on a nonconductive surface. The effect is enhanced when the polarity (sign) of the E-field is caused to alternate.

Thus, according to one aspect, particles are attracted to the front side of a sacrificial cleaning reticle or modified substrate. This cleaning substrate does not have a conductive coating fully covering the reticle backside. This allows the E-field to penetrate to a volume of space in front of the reticle. By polarity switching in combination with or without EUV exposure charged particles can be attracted to a nonconductive front (outward facing) side of the substrate.

Figure 3:
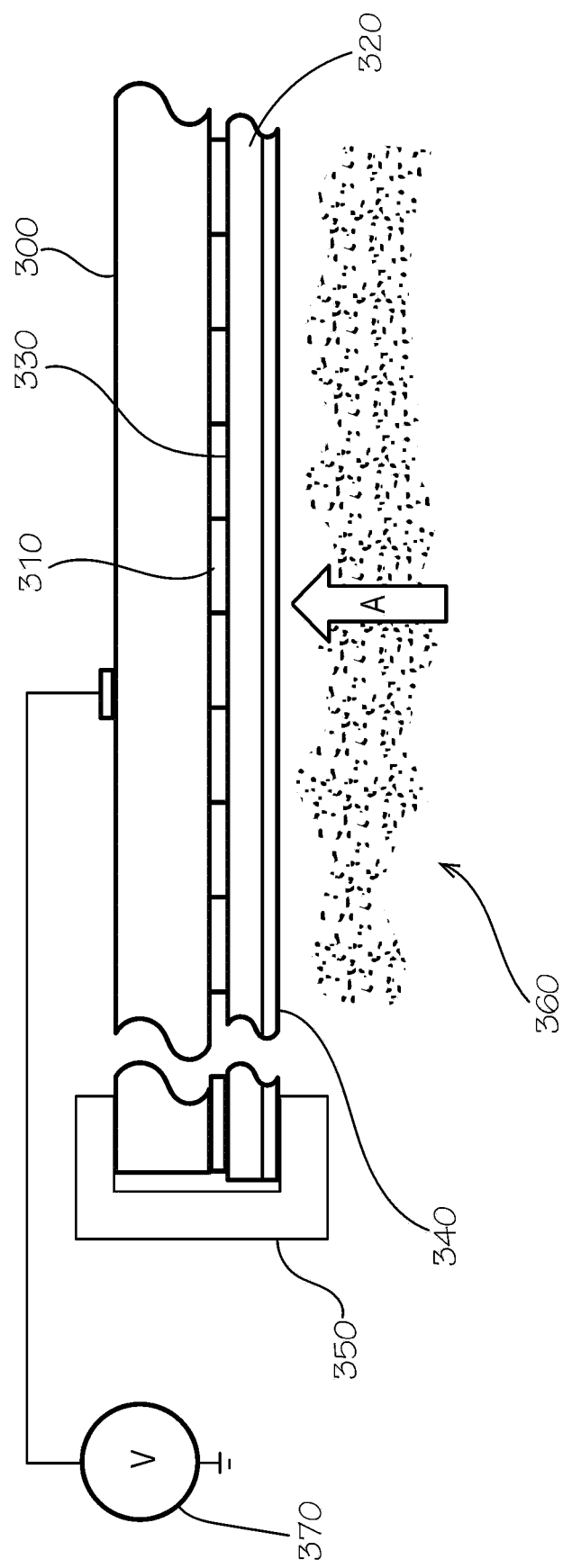
FIG. 3 is a not-to-scale diagram of an arrangement for an electrostatic chuck and a substrate according to an aspect of an embodiment.

FIG. 3 shows an embodiment according to one aspect of the present disclosure. As shown in FIG. 3, there is shown an electrostatic chuck 300 having a front surface with a pattern of burls 310. FIG. 3 is not to scale; the relative sizes of some of the elements have been altered to make the figure easier to understand.

Adjacent to the front surface of the electrostatic chuck 300 is a cleaning reticle or substrate 320. The substrate 320 may have the first coating 330 which covers part of an upper (facing the clamp) surface of the substrate 320. The first coating 330 may include areas that are conductive so that application of a voltage to the electrostatic chuck 300 creates an electrostatic force which causes the upper surface of the substrate 320 to adhere to the lower surface of electrostatic chuck 300 with its burls 310. The substrate 320 may also be provided with a coating 340 on its lower (facing outward) surface which may also include areas that are conductive. If conductive coatings are present they are arranged such that an E-field generated by the electrostatic chuck 300 can penetrate through gaps in the coatings and extend into the volume adjacent to the lower surface of the substrate 320. Alternatively, the substrate 320 may be provided with no conductive coating at all and be held in place by mechanical clamp 350.

The electrostatic field that extends into the volume adjacent the lower surface of the substrate 320 causes particles 360 in that volume to tend to move in the direction of arrow A and adhere to the lower surface of the substrate 320. This effect eliminates or reduces the number of particles in the volume adjacent the lower surface of the substrate 320.

To create the electrostatic field, the electrostatic chuck 300 is preferably supplied with voltage from a voltage source 370. The voltage source 370 may be configured to switch polarity at least once to facilitate attraction of a greater number of particles 360 to the lower surface of substrate 320.

FIG. 4A shows a conventional substrate 320 made of a nonconductive material such as glass with a coating 330 made of a conductive material such as a metal, for example, CrN, covering the entire surface of the substrate 320. Coating 330 on substrate 320 such as that shown in FIG. 4A would permit securing the substrate 320 to the clamp using electrostatic force but it would not permit an electrostatic field generated by the electrostatic chuck 300 to penetrate the substrate 320 and extend into the volume adjacent the lower surface of the substrate 320. Thus, the electrostatic field would not be able to attract particles in that volume to the surface of the lower surface of the substrate 320.

FIG. 4B shows a substrate 320 having a conductive coating 330 that covers only part of the upper surface of the substrate 320 to permit an E-field to pass through it. In FIG. 4B, there is a metal coated outer frame 330 with no conductive film in the center portion upper surface of the substrate 320. This area may be left uncoated or may be provided with a nonconductive film (e.g. Kapton® (poly (4,4'-oxydiphenylene-pyromellitimide)) in the center portion. The presence of conductive coating 330 facilitate adherence of the upper surface of the substrate 320 while the portion of the upper surface of the substrate 320 which has no conductive coating will permit passage of the electrostatic field generated by the electrostatic chuck 300.

FIG. 4C shows another arrangement in which a central portion of the upper surface of the substrate 320 has no conductive coating 330. Again, this central portion may have no coating or may have a coating of a nonconductive material. FIG. 4D shows an arrangement in which the substrate 320 has no coating. For such a substrate 320, the electrostatic field generated by electrostatic chuck 300 will not cause the substrate 322 to adhere to the electrostatic chuck 300, so that supplemental clamping means such as, for example, safety catches, may be used to secure the substrate 320 to the electrostatic chuck 300.

Figure 5A:
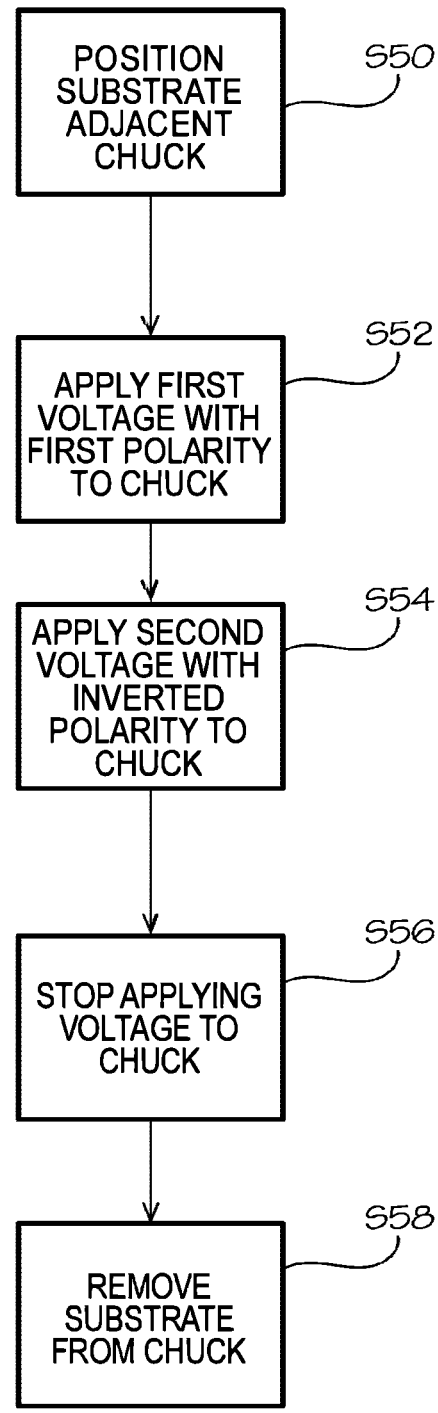
FIG. 5A is a flowchart illustrating a cleaning process using a cleaning substrate and an electrostatic chuck according to an aspect of an embodiment.

FIG. 5A is a flowchart showing a process for removing particles from a volume near the face of an electrostatic chuck. In a step S50 the substrate is positioned adjacent to the electrostatic chuck, referred to simply as a chuck in the figure. At this time additional means may be used to secure the substrate to the chuck. In a step S52 a first voltage having a first polarity is applied to the chuck. In a step S54 a second voltage having a second polarity inverted from the first polarity is applied to the chuck. This second voltage may have a magnitude (as opposed to sign) that is the same as or different from the magnitude of the first voltage. In a step S56, application of voltage to the chuck is discontinued and in a step S58 the substrate is removed from the chuck.

Figure 5B:
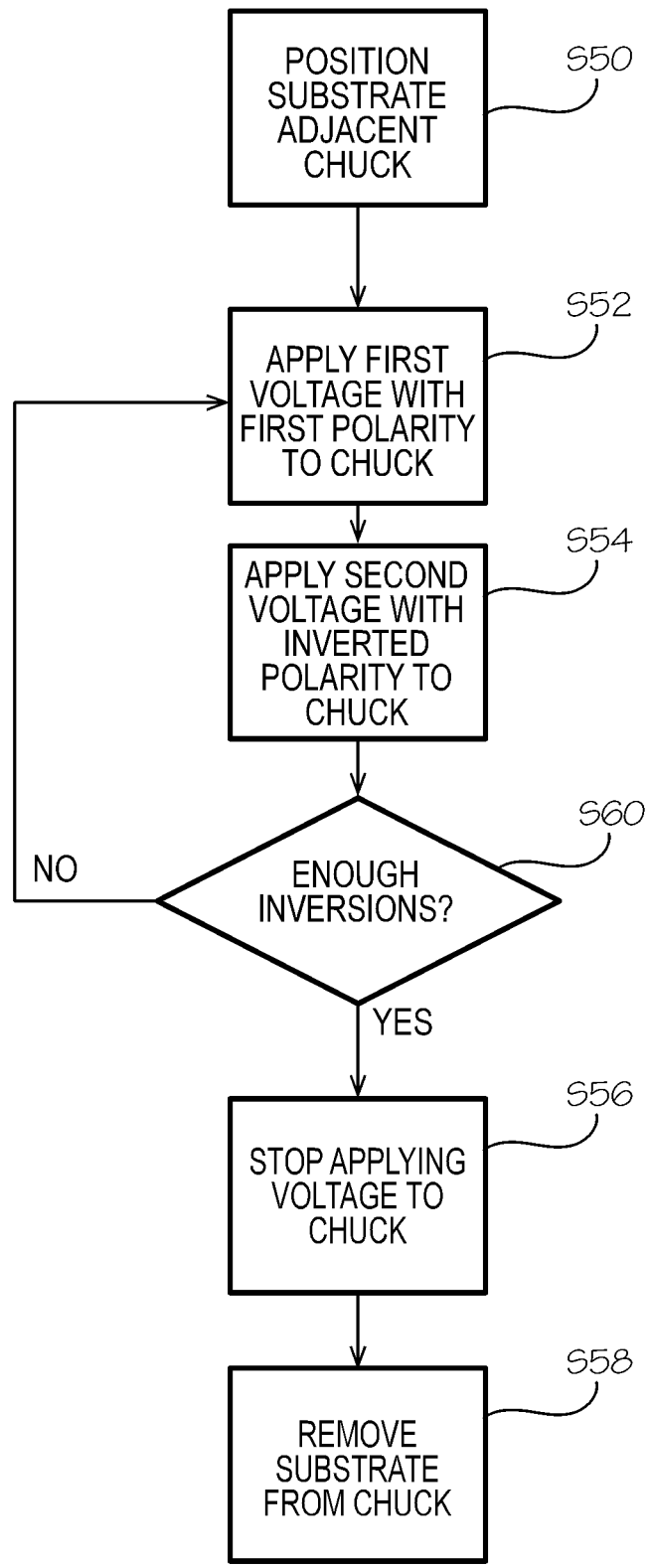
FIG. 5B is a flowchart illustrating another cleaning process using a cleaning substrate and an electrostatic chuck according to an aspect of an embodiment.

FIG. 5B is a flowchart showing another process for removing particles from a volume near the face of an electrostatic chuck. As in the method described in connection with FIG. 5A, in a step S50 the substrate is positioned adjacent to the electrostatic chuck. At this time additional means may be used to secure the substrate to the chuck. In a step S52 a first voltage having a first polarity is applied to the chuck. In a step S54 a second voltage having a second polarity inverted from the first polarity is applied to the chuck. Again, the second voltage may have a magnitude that is the same as or different from the magnitude of the first voltage. In a step S60, it is determined whether a predetermined number of voltage inversions have been applied. If yes, then in step S56 application voltage to the chuck is discontinued and in a step S58 the substrate is removed from the chuck. If no then the process reverts to step S52.

Figure 5C:
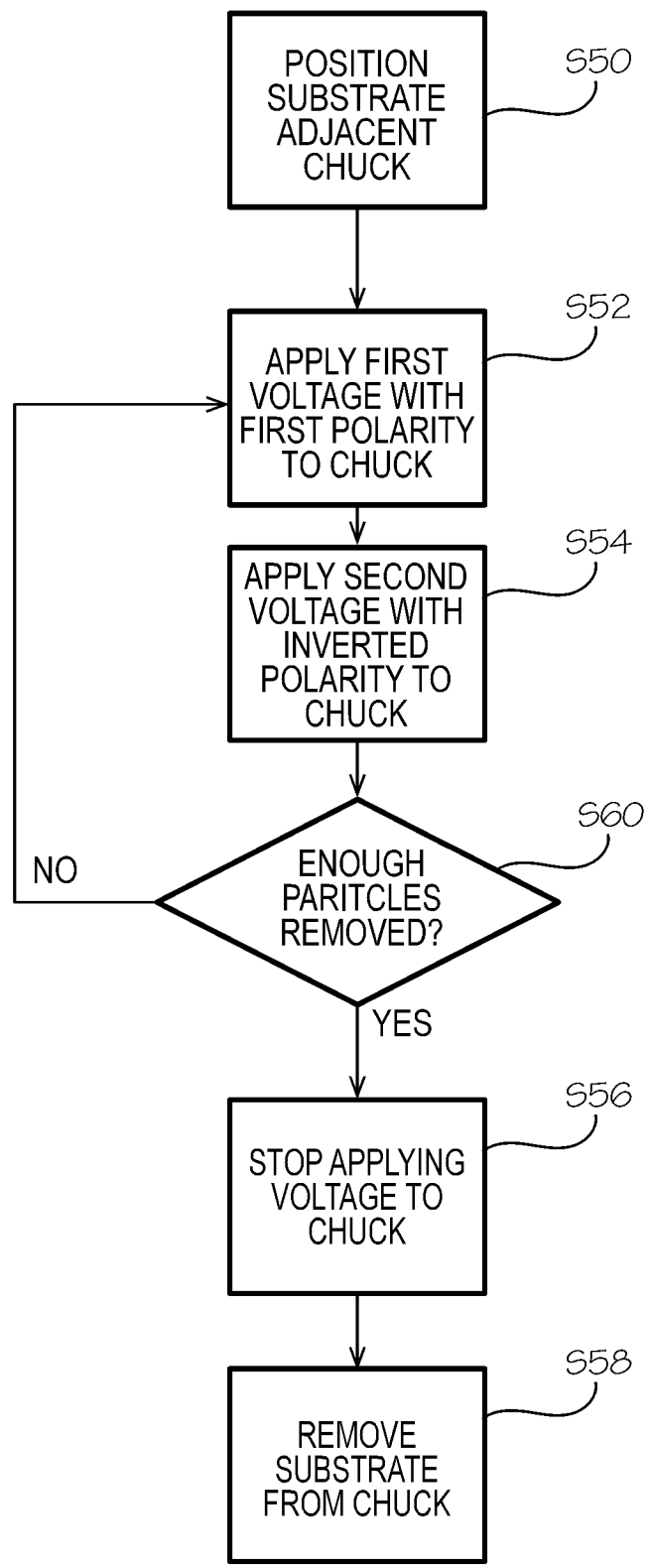
FIG. 5C is a flowchart illustrating another cleaning process using a cleaning substrate and an electrostatic chuck according to an aspect of an embodiment.

FIG. 5C is a flowchart showing another process for removing particles from a volume near the face of an electrostatic chuck. As in the methods described above in a step S50 the substrate is positioned adjacent to the electrostatic chuck. At this time additional means may be used to secure the substrate to the chuck. In a step S52 a first voltage having a first polarity is applied to the chuck. In a step S54 a second voltage having a second polarity inverted from the first polarity is applied to the chuck. Again, the second voltage may have a magnitude that is the same as or different from the magnitude of the first voltage. In a step S62, it is determined whether enough particles of been removed. This may be determined, for example, by a sensor which senses the particle concentration or simply determining that an amount of time has passed which is known a priori to be sufficient to clear the volume of a sufficient number of particles, or a number of voltage inversions have been applied which is known a priori to be sufficient to clear the volume of a sufficient number of particles. If yes, then in step S56 application voltage to the chuck is discontinued and in a step S58 the substrate is removed from the chuck. If no then the process reverts to step S52.

The capability of cleaning the volume in front of the clamp in place without disturbing the vacuum in the chamber in which the clamp is located avoids downtime. The advantages arising from use of the disclosed subject matter may be realized for clamping structures for holding a pattering device such as a reticle as well as for clamping structures that hold the wafer that is to be processed.

As shown, the cleaning substrate 320 may also include a layer 340 of a material that will assist in retention of the particulate contaminants. In one example, such layers may include polyimide, Viton®, PTFE (polytetrafluoroethylene), Kapton®, and Teflon®.

Once the cleaning substrate 320 has been removed from electrostatic chuck 300, the cleaning substrate 320 may be cleaned to remove particles that have adhered to it and then re-used.

The above methods may be enhanced by exposing the area adjacent the sacrificial reticle to ionizing radiation such as EUV radiation prior to extending the E-field into the volume adjacent the reticle. This radiation may place electrical charges on the particles thus increasing the amount of force the E-field will exert on the particles as opposed to when the particles are electrically neutral. Other methods to charge particles include using an ionization unit or using other radiation such as applied by a laser.

The above description is in terms of clearing a volume adjacent the cleaning substrate reticle (including particles adhering to surfaces in that volume) as an example. Polarity switching also enhances a cleaning effect of the cleaning substrate on the surface of the clamp facing the cleaning substrate. For example, particles in the gaps between burls of a surface of a clamp can be dislodged from that surface and attracted to the surface of the cleaning substrate where they will tend to adhere. Particle removal is thus effected by performing at least one polarity switch. Under the initial polarity (e.g., positive) particles in the clamp/sacrificial cleaning reticle interface are attracted to the clamp. When the polarity is reversed (e.g., to negative), the particles are repelled by the opposite polarity and transfer onto the surface of the sacrificial cleaning reticle facing the clamp. Additional polarity switches result in additional particle removal because the particles tend to retain charge and will continue to adhere to the sacrificial cleaning reticle despite an additional polarity inversion. In terms of the outward facing surface of the sacrificial cleaning reticle, particles attached to a nonconductive surface of the sacrificial cleaning reticle will remain attached even after multiple polarity switches and more particles will be dislodged from grounded surfaces in the volume adjacent the sacrificial cleaning reticle with each switch. However, the number of polarity switches and/or the amount of time polarity switching is carried out cannot be so great that particles on the sacrificial reticle lose their charge and dislodge or jump back to the clamp or grounded surfaces when polarity is next switched.

The above description is in terms of using a cleaning substrate using a cleaning reticle and reticle clamp as an example, but it will be readily apparent to one of ordinary skill that the teachings herein may be applied to other parts of the EUV system.

The embodiments may further be described using the following clauses:

1. Apparatus comprising
 a stage adapted to support a substrate, and
 a voltage supply electrically connected to the stage and adapted to operate in a mode in which the voltage supply switches polarities.
2. Apparatus of clause 1 wherein the stage comprises an electrostatic chuck.
3. Apparatus comprising
 a stage; and
 a substantially planar substrate arranged on the stage, the substrate having a first surface facing the stage and a second surface facing away from the stage, at least a first portion of the first surface lacking a conductive coating and at least a second portion of the second surface lacking a conductive coating, the first portion and the second portion being arranged with respect to one another such that an electric field can pass through the substrate.
4. Apparatus of clause 3 wherein the stage comprises an electrostatic chuck.
5. Apparatus of clause 4 wherein the first surface is partially covered with a conductive coating.
6. Apparatus of clause 3 further comprising a voltage source for applying a voltage to the electrostatic chuck and generating an electric field that extends past the substrate into a space adjacent the second surface.
7. Apparatus of clause 6 wherein the voltage source is adapted to alternate polarity of its output voltage.
8. Apparatus of clause 3 wherein the substrate is made of a nonconductive material.
9. Apparatus of clause 3 wherein the first surface is at least partially coated with a nonconductive material.
10. Apparatus of clause 3 wherein the second surface is at least partially coated with a nonconductive material.
11. Apparatus of clause 10 wherein the nonconductive material comprises Kapton.
12. Apparatus of clause 3 wherein neither the first surface nor the second surface comprises a coating having conductive material, and further comprising a mechanical clamp for securing the substrate to the electrostatic chuck.
13. Apparatus comprising
 a stage;
 a substantially planar having a first surface and a second surface, the substrate being placed on the stage such that the first surface faces the stage and the second surface faces away from the stage, at least a first portion of the first surface lacking a conductive coating and at least a second portion of the second surface lacking a conductive coating, the first portion and the second portion being arranged with respect to one another such that an electric field can pass through the substrate; and
 a voltage supply electrically connected to the stage and adapted to operate in a mode in which the voltage supply switches polarities so as to attract particles to the second surface.
14. Apparatus of clause 13 wherein the stage comprises an electrostatic chuck.
15. Apparatus of clause 13 wherein the first surface is partially covered with a conductive coating.
16. Apparatus of clause 13 wherein the second surface is at least partially covered with a nonconductive coating.
17. Apparatus of clause 13 wherein the voltage supply is adapted to generate an electric field that extends past the substrate into a volume of space adjacent the second surface.
18. Apparatus of clause 13 wherein the substrate is made of a nonconductive material.
19. Apparatus of clause 13 wherein the first surface is at least partially coated with a nonconductive material.
20. Apparatus of clause 19 wherein the nonconductive material comprises Kapton.
21. Apparatus of clause 13 wherein neither the first surface nor the second surface comprises a coating having conductive material, and further comprising a mechanical clamp for securing the substrate to the electrostatic chuck.
22. A method comprising the steps of:
 providing a stage;
 arranging a substantially planar substrate on the stage, the substrate having a first surface and a second surface, at least a first portion of the first surface lacking a conductive coating and at least a second portion of the second surface lacking a conductive coating, the first portion and the second portion being arranged with respect to one another such that an electric field can pass through the substrate; and
 applying a voltage to the stage and substrate in a manner in which a polarity of the voltage switches at least once.
23. A method of clause 22 wherein the stage comprises an electrostatic chuck.
24. A method comprising the steps of:
 providing a stage;
 arranging a substantially planar substrate on the stage such that a first surface of the substrate faces the stage and a second surface of the substrate faces away from the stage, at least a first portion of the first surface lacking a conductive coating and at least a second portion of the second surface lacking a conductive coating, the first portion and the second portion being arranged with respect to one another such that an electric field can pass through the substrate; and attracting particles to the second surface by applying a voltage to the stage and substrate in a manner in which a polarity of the voltage switches at least once.

25. A method of clause 24 further comprising a step before the attracting step of charging the particles.

26. A method of clause 25 further comprising the step of charging the particles comprises exposing the particles to ionizing radiation.

27. A method of clause 24 wherein the stage comprises an electrostatic chuck.

28. A method comprising the steps of:
providing a stage;
arranging a substantially planar substrate on the stage, the substrate having a first surface facing the stage and a second surface facing away from the stage, at least a first portion of the first surface lacking a conductive coating and at least a second portion of the second surface lacking a conductive coating, the first portion and the second portion being arranged with respect to one another such that an electric field can pass through the substrate; and
applying a voltage to the stage and substrate in a manner in an electric field extends past the substrate and into a space adjacent the second surface to attract particles in the space towards the second surface.

29. A substantially planar cleaning substrate comprising a nonconductive material and having a top substantially planar surface and a bottom substantially planar surface, the top surface comprising at least one first area covered by a layer comprising a conductive material and at least one second area not covered by a layer comprising a conductive material.

30. A substantially planar cleaning substrate of clause 29 wherein the conductive material comprises chromium nitride.

31. A substantially planar cleaning substrate of clause 29 wherein the at least one second area is covered by a layer of a nonconductive material.

32. A substantially planar cleaning substrate of clause 31 wherein the nonconductive layer comprises poly (4,4'-oxydiphenylene-pyromellitimide.

33. A substantially planar cleaning substrate of clause 30 comprising a nonconductive layer on the second surface.

34. A cleaning substrate of clause 33 in which the nonconductive layer comprises a material adapted to retain particles impinging on the nonconductive layer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The invention claimed is:

1. An apparatus comprising:
an electrostatic chuck;
a substantially planar cleaning substrate arranged on the electrostatic chuck, the substrate having a first surface facing the electrostatic chuck and a second surface facing away from the electrostatic chuck, at least a first portion of the first surface lacking a conductive coating and at least a second portion of the second surface lacking a conductive coating, the first portion and the second portion being arranged with respect to one another such that an electric field can pass through the substrate; and
a voltage source configured to apply a voltage to the electrostatic chuck to generate the electric field, which extends past the substrate into a space adjacent the second surface to attract particles to the cleaning substrate.

2. The apparatus of claim 1, wherein the first surface is partially covered with a conductive coating.

3. The apparatus of claim 1, wherein the voltage source is adapted to alternate polarity of its output voltage.

4. The apparatus of claim 1, wherein the substrate comprises a nonconductive material.

5. The apparatus of claim 1, wherein the first surface is at least partially coated with a nonconductive material.

6. The apparatus of claim 1, wherein the second surface is at least partially coated with a nonconductive material.

7. The apparatus of claim 6, wherein the nonconductive material comprises poly-oxydiphenylene-pyromellitimide.

8. The apparatus of claim 6, wherein the conductive material comprises chromium nitride.

9. The apparatus of claim 1, wherein neither the first surface nor the second surface comprises a coating having conductive material, and further comprises a mechanical clamp for securing the substrate to the electrostatic chuck.

10. The apparatus of claim 1, wherein the voltage supply switches polarities so as to attract the particles to the second surface.

11. A lithography apparatus, comprising:
an illumination system configured to produce a radiation beam;
a patterning device configured to pattern the radiation beam;
a projection system configured to project the patterned radiation beam;
an electrostatic chuck;
a substantially planar cleaning substrate arranged on the electrostatic chuck, the substrate having a first surface facing the electrostatic chuck and a second surface facing away from the electrostatic chuck, at least a first portion of the first surface lacking a conductive coating and at least a second portion of the second surface lacking a conductive coating, the first portion and the second portion being arranged with respect to one another such that an electric field can pass through the substrate; and
a voltage source configure to apply a voltage to the electrostatic chuck to generate the electric field, which extends past the substrate into a space adjacent the second surface to attract particles to the cleaning substrate.

12. The lithography apparatus of claim 11, wherein the first surface is partially covered with a conductive coating.

13. The lithography apparatus of claim 11, wherein the voltage source is adapted to alternate polarity of its output voltage.

14. The lithography apparatus of claim 11, wherein the substrate comprises a nonconductive material.

15. The lithography apparatus of claim 11, wherein the first surface is at least partially coated with a nonconductive material.

16. The lithography apparatus of claim 11, wherein the second surface is at least partially coated with a nonconductive material.

17. The lithography apparatus of claim 11, wherein the nonconductive material comprises poly-oxydiphenylene-pyromellitimide.

18. The lithography apparatus of claim 11, further comprising:
a mechanical clamp configured to secure the substrate to the electrostatic chuck,
wherein neither the first surface nor the second surface comprises a coating having conductive material.

19. A method comprising:
arranging a substantially planar cleaning substrate on an electrostatic chuck, the substrate having a first surface and a second surface, at least a first portion of the first surface lacking a conductive coating and at least a second portion of the second surface lacking a conductive coating, the first portion and the second portion being arranged with respect to one another such that an electric field can pass through the substrate; and
applying a voltage to the electrostatic chuck and cleaning substrate to generate an electric field that extends past the cleaning substrate and into a space adjacent the second surface to attract particles in the space towards the second surface.

20. The method of claim 19, wherein a polarity of the voltage switches at least once.

21. The method of claim 19, further comprising exposing the particles to ionizing radiation.

* * * * *